United States Patent
Abe et al.

(10) Patent No.: US 6,402,013 B2
(45) Date of Patent: Jun. 11, 2002

(54) THERMOSETTING SOLDERING FLUX AND SOLDERING PROCESS

(75) Inventors: Hisayuki Abe, Ichikawa; Toshihiko Taguchi, Kitakatsushika-gun; Yuji Kawamata, Haga-gun; Akiko Iwano, Mouka, all of (JP)

(73) Assignees: Senju Metal Industry Co., LTD; TDK Corporation, both of Tokyo (JP)

( * ) Notice: Subject to any disclaimer, the term of this patent is extended or adjusted under 35 U.S.C. 154(b) by 0 days.

(21) Appl. No.: 09/726,588

(22) Filed: Dec. 1, 2000

(30) Foreign Application Priority Data

Dec. 3, 1999 (JP) ............................................. 11-344979

(51) Int. Cl.⁷ .......................... B23K 31/02; B23K 35/36
(52) U.S. Cl. .................... 228/223; 228/224; 228/248.1; 148/23; 148/24
(58) Field of Search ................................ 228/224, 214, 228/215, 207, 223, 248.1; 148/23, 24

(56) References Cited

U.S. PATENT DOCUMENTS

| | | | |
|---|---|---|---|
| 5,167,729 A | * | 12/1992 | Takemoto et al. |
| 5,215,601 A | * | 6/1993 | Gomi et al. |
| 5,741,622 A | * | 4/1998 | Arima |
| 5,830,389 A | * | 11/1998 | Capote et al. |
| 5,851,311 A | * | 12/1998 | Diamant et al. |
| 5,989,362 A | * | 11/1999 | Diamant et al. |
| 6,220,501 B1 | * | 4/2001 | Tadauchi et al. |

FOREIGN PATENT DOCUMENTS

| | | |
|---|---|---|
| JP | 2503099 | 5/1992 |
| JP | 6269980 | 9/1994 |
| JP | 8090283 | 4/1996 |

OTHER PUBLICATIONS

US 2001/0019075 A1 Abe et al. (Sep. 6, 2001).*

* cited by examiner

Primary Examiner—Tom Dunn
Assistant Examiner—Kiley Stoner
(74) Attorney, Agent, or Firm—Michael Tobias

(57) ABSTRACT

A soldering flux suitable for soldering of small electronic components comprises 0.1–50 mass percent of an organic acid, 5–40 mass percent of a solvent, and 10–95 mass percent of a thermosetting resin (including a curing agent), which is preferably a bisphenol A epoxy resin and an acid anhydride or amine curing agent. This flux can be used to prepare a solder paste by mixing with solder powder. This soldering flux can secure an electronic component simultaneously by soldering and by the resin, simply by a soldering operation at a soldering temperature of at least 150° C., and cleaning after soldering is no longer necessary.

20 Claims, No Drawings

THERMOSETTING SOLDERING FLUX AND SOLDERING PROCESS

BACKGROUND OF THE INVENTION

This invention relates to a soldering flux suitable for soldering of components and particularly small electronic components, and to a soldering paste which uses it and to a soldering method for components. When small electronic components are soldered using a flux according to the present invention, simultaneous with soldering, components can be strongly secured by a resin.

Fluxes which are used for soldering generally function to clean soldered joints, to prevent oxidation of metal, and to lower the surface tension of molten solder to improve wettability. Conventional fluxes were an auxiliary material for facilitating soldering through such functions, and they had no use after soldering. For this reason, there have been many proposals for adjusting the compositions thereof so as to make flux removal after soldering easy, and of means for rendering flux residue harmless.

With recent advances in reducing the size of electronic components, the electrodes, which are the areas of electronic components which are soldered, have also decreased in size. For this reason, an adequate amount of solder can not be used, and the joining strength by soldering alone has come to be inadequate to secure components. Namely, with small electronic components, the area and the volume of the region to be soldered is small, so a component can not be adequately joined and maintained by soldering alone, and it is necessary to further provide some other component-securing means.

As a component-securing means for strengthening joining by soldering, components are secured by covering the periphery of a soldered area with a resin by underfilling or resin molding. For this purpose, it is necessary to perform cleaning and clean off flux residue. However, with small electronic components, spaces have a small size of at most 100 micrometers, and cleaning can not be effectively carried out, so it is difficult to adopt such a securing means.

Merely for the purpose of increasing joining strength, it is also conceivable to employ an adhesive. However, after soldering, solder is present at the joining interface, so it is difficult to apply an adhesive thereto.

It is also possible to carry out electrically conducting joining of components without using solder by using an electrically conducting adhesive which contains an electrically conducting filler. However, with an electrically conducting adhesive, the electrical conductivity of the joint is not sufficiently high, so for joining electronic components, soldering is best.

SUMMARY OF THE INVENTION

Accordingly, an object of the invention is to provide a new means which can increase the joining strength of electronic components when carrying out soldering of small electronic components.

Another object of this invention is to provide a soldering method, which can strongly join small electronic components by carrying out only conventional soldering operations without the addition of new steps and which does not require cleaning after soldering, and a flux for use therein.

The present inventors noted that of the joining surfaces of a component being soldered, in addition to the area occupied by electrodes, an area about the same as that of the electrodes remains, and that area can also be utilized for securing of the component. They also found that by including a thermosetting resin such as an epoxy resin in flux, when soldering small electronic components, in addition to soldering due to melting of solder on electrodes, a securing action is also exhibited at the same time by the thermal curing of the thermosetting resin in the flux around its periphery, and that it is possible to achieve the above-described objects.

According to one aspect, this invention is a soldering flux comprising 0.1–70 mass percent of an organic acid, 5–40 mass percent of a solvent, and a total of 10–95 mass percent of a thermosetting resin and a curing agent, wherein when a component is being soldered, it exhibits a function of securing the component by means of the thermosetting resin.

In a preferred embodiment, the organic acid is one or more classes selected from the group consisting of rosin, carboxylic acids, and carboxylic acid anhydrides. It is particularly preferable for the organic acid to contain a rosin as at least a portion thereof. The thermosetting resin is preferably an epoxy resin, and more preferably a bisphenol A epoxy resin obtained by reaction of bisphenol A and epichlorohydrin. In this case, the curing agent for the thermosetting resin is preferably one or more classes selected from the group consisting of carboxylic acid anhydrides and amines. The flux of this invention may further contain 0.1–10 mass percent of a thixotropic agent.

According to another aspect, the present invention provides a solder paste which is a mixture of a powder of a solder alloy with a melting point of at least 150° C. and the above-described flux. In particular, in the case of a solder paste, the total amount of the thermosetting resin and the curing agent in the flux is preferably in the range of 50–95 mass percent so that they are the main component of the flux.

According to yet another aspect, the present invention relates to a method for soldering a first member and a second member using the above-described flux and solder, or the above-described solder paste. Preferably the first member is an electronic component and the second member is a substrate having a large number of electrodes, such as a printed circuit board, and the soldering temperature is at least 150° C. In a soldering method according to the present invention, securing by soldering and by the thermosetting resin in the flux can be simultaneously achieved.

Incorporation of an epoxy resin as a thermosetting resin in a soldering flux is disclosed in Japanese Published Unexamined Patent Application Hei 8-90283 and Japanese Patent No. 2,503,099. However, as will be next explained, neither of these is aimed at securing an electronic component by the resin in the flux.

The flux which is disclosed in Japanese Published Unexamined Patent Application Hei 8-90283 contains 10–40 mass percent of an epoxy resin which is incorporated in the flux in place of rosin in order to prevent flux residue remaining on the surface of components after soldering from peeling off of the components. It is intended to facilitate coverage of an electronic component with resin when the soldered component is subjected to resin molding with the same resin after soldering.

The flux disclosed in Japanese Patent No. 2,503,099 is used with a solder for reflow soldering of a printed substrate. It contains an epoxy resin or a carboxyl containing resin or the like which is added so that flux residue will not crack and so as to prevent, when a rosin flux is liquefied at high temperature, the ionic components present therein from being liberated and acting as a cause of corrosion. The amount of the epoxy resin which is added is at most 20 mass percent.

In Japanese Published Unexamined Patent Application Hei 6-269980, an electrically conducting paste for soldering leads is disclosed which consists essentially of solder powder and an epoxy resin. In addition to solder, this electrically conducting paste consists essentially of the epoxy resin, and the electrically conducting paste does not function as a flux.

DETAILED EXPLANATION OF THE INVENTION

A soldering flux according to this invention can be prepared by adding a thermosetting resin (such as an epoxy resin) to a conventional rosin flux, for example. When the flux is heated to preferably at least 150° C. during soldering, such as during reflow of solder paste, curing of the thermosetting resin in the flux occurs, so joining by the thermosetting resin is added to joining by soldering. Thus, the securing force is increased, and even in the case of soldering small electronic components, a sufficient joining strength can be provided by soldering operation alone.

Namely, in this invention, the flux component remaining after soldering, which is conventionally referred to as flux residue, can also be used in joining of components. The thermoset flux component remaining after soldering can contain, in addition to the thermoset resin, non-volatile components in the flux such as rosin. Even if flux components such as rosin remain, they are secured by the thermosetting resin, and it becomes difficult for them to peel off, so they have no adverse effect on the joint. Accordingly, it is not necessary to perform cleaning, which was conventionally carried out in order to remove flux residue after soldering.

When the thermosetting resin is an epoxy resin, properties such as the joining strength of a component, the hardness of flux residue (adhered resin), and solderability when soldering is carried out using a flux according to the present invention can be controlled by factors such as the epoxy equivalent and the amount of the epoxy resin, and the type and the amount of the curing agent.

Components which are suitable for soldering using the flux according to the present invention are small electronic components. They include, for example, semiconductor packages such as flip chips and CSP's (chip size packages) and other small chip components which have conventionally required underfilling (resin securing). Examples of small electronic components of this type are flip chips with a bump pitch of at most 0.3 mm and fine pitch CSP's; components which have small electrodes for soldering and which are weak when joined only by soldering, such as LGA's (land grid arrays); and minute chip resistors, coils, capacitors, transistors, and the like such as 0603 components (length 0.6 mm, width 0.3 mm), and the like. In addition, components having a narrow gap (such as at most 0.1 mm) between areas to be soldered of the components and a substrate and which can not be made adequately clean even if cleaning is performed are suitable for soldering according to the present invention.

When a flux according to the present invention is used for coating an area to be soldered separately from solder, it is suitable for solder bump formation using solder balls, for electrodes which are precoated with solder, and for reflow of preformed solder.

A flux according to the present invention can be uniformly mixed with a solder powder (a powder of a solder alloy) and used as a solder paste. After this solder paste is applied to an area to be soldered by printing or with a dispenser of the like, a chip component can be mounted thereon and reflow soldering can be carried out.

When soldering is carried out by applying just the flux to an area to be soldered, a single flux can simultaneously perform a fluxing action during soldering and can perform securing by means of the thermosetting resin surrounding the solder. When carrying out soldering of chip components using a solder paste obtained by mixing a flux and a solder powder, at the time of heating, the flux in the paste penetrates between the chip component and the printed substrate, and when soldering is completed, the thermosetting resin secures the chip component to the printed substrate.

Due to the securing action of the thermosetting resin, a flux according to the present invention can make the joining strength of an electronic component which has a small soldering region and which had an inadequate strength by soldering alone the same as or greater than the joining strength of a conventional electronic component having a large soldering region and using a large amount of solder. Accordingly, it becomes unnecessary to carry out underfilling or resin molding in addition to soldering.

A flux according to the present invention can be prepared by, for example, adding a thermosetting resin and a curing agent to a conventional rosin flux. The thermosetting resin which is added is preferably one which sets at or above the liquidus temperature of the solder alloy which is used with the flux. If the thermosetting resin sets before the solder melts, deformation of the solder may be impeded.

The amount of the thermosetting resin in the flux of the present invention (when a curing agent is used, the total amount including the curing agent) is in the range of 10–95 mass percent. If the amount of the thermosetting resin is less than 10 mass percent, the above-described desired effects can not be sufficiently obtained, and if it exceeds 95 mass percent, a fluxing action is not sufficiently exhibited. The amount of the thermosetting resin is preferably at least 25 mass percent, and more preferably, it is at least 50 mass percent so as to be the main component of the flux and in particular it is preferably made a large amount of more than 50 mass percent. In particular, when the flux is used in the form of a solder paste, the thermosetting resin is preferably used in a large amount in this manner. The amount of the thermosetting resin is most preferably 60–85 mass percent.

One example of a thermosetting resin which is suitable for use in a flux according to the present invention is an epoxy GEM resin. Representative examples of epoxy resins are bisphenol A epoxy resins which are obtained by reacting bisphenol A and epichlorohydrin, and novolac epoxy resins which are obtained by reacting an orthocresol novolac resin or a phenolic novolac resin with epichlorohydrin, and they are preferably used. However, other epoxy resins such as brominated epoxy resins, glycidyl ester epoxy resins, glycidyl amine epoxy resins, and alicyclic epoxy resins can also be used.

As a curing agent for curing the epoxy resin, it is preferable to use a polyamine or a carboxylic acid anhydride. The curing temperature of the epoxy resin depends upon the particular curing agent, so the curing agent which is used is preferably selected such that curing of the epoxy resin takes place at a temperature at or above the liquidus temperature of the solder.

For example, as an amine curing agent, an aromatic amine having a high curing temperature, such as 4,4'-diaminodiphenyl sulfone is suitable. Examples of carboxylic acid anhydrides suitable as a curing agent include phthalic anhydride, tetrahydrophthalic anhydride, and trimellitic anhydride.

When a carboxylic acid anhydride is used as a curing agent for the epoxy resin, the anhydride functions not only as a curing agent but, as will be described below, functions as an organic acid component to exhibit a fluxing action. For this reason, it is more preferable to use an acid anhydride rather than a polyamine as a curing agent.

A cure accelerator which is commonly used in the curing of an epoxy resin may be added in order to lower the curing temperature or increase the securing strength. Amines, sulfonic acids, amine boron trifluorides, polyamide resins, and the like can be used as a cure accelerator.

In addition to the above-described thermosetting resin, a flux according to the present invention also contains an organic acid which is commonly used in soldering flux. The organic acid is necessary in order to exhibit the fluxing action, i.e., to clean the area to be joined and improve the wettability by solder of the area. A typical example of the organic acid is a rosin, but other carboxylic acids or anhydrides thereof may be used, and two or more classes thereof may be used in combination. As stated above, in a flux according to the present invention, a carboxylic acid anhydride performs the functions of both an epoxy curing agent and an organic acid.

The rosin can be selected from all the types which are used in conventional rosin fluxes. Specific examples thereof include ordinary gum rosin, tall oil rosin, wood rosin, as well as their derivatives such as polymerized rosins, hydrogenated rosins, rosin esters, rosin modified resins, and the like. Rosins exhibit a large fluxing action, so preferably a rosin is present in the flux as at least a portion of the organic acid.

As a carboxylic acid, aliphatic, alicyclic, and aromatic mono and polycarboxylic acids having 4–22 carbon atoms can be used. Some specific examples of such acids include capric acid, lauric acid, myristic acid, palmitic acid, stearic acid, arachic acid, behenic acid, glutaric acid, adipic acid, pimelic acid, suberic acid, azelaic acid, sebacic acid, fumaric acid, and the like.

A carboxylic acid anhydride can also be used as the organic acid. A carboxylic acid anhydride functions as an epoxy curing agent, so as stated with respect to curing agents, it is preferable to use such a class that produces an epoxy curing reaction at or above the liquidus temperature of the solder.

The amount of the organic acid in a flux according to the present invention is 0.1–70 mass percent. When an acid anhydride is used as the epoxy curing agent, the amount of the organic acid also includes the amount of the acid anhydride. If the amount of the organic acid is less than 0.1 mass percent, a fluxing effect is not exhibited, while if the amount exceeds 70 mass percent, the securing strength after soldering is no longer adequate. The amount of the organic acid is preferably at most 50 mass percent.

Even when the flux contains an acid anhydride as a curing agent, the flux preferably contains another organic acid which does not function as a curing agent, and preferably a rosin in addition to the acid anhydride. Using another organic acid in addition to the acid anhydride which is a curing agent increases the fluxing action. The amount of the other organic acid is preferably at least 0.5 mass percent, it is more preferably at least 3 mass percent, and it is particularly preferable for it to be at least 5 mass percent. The upper limit can be as high as 50 mass percent, but preferably it is 20 mass percent. Similarly, in the case when the curing agent is an amine, the flux preferably contains as an organic acid another organic acid which does not function as a curing agent in the same amount as described above.

The solvent can be one which is conventionally used in a soldering flux and particularly in a rosin flux. For example, alcoholic solvents such as ethyl alcohol, isopropyl alcohol, and butyl carbitol, ester solvents such as ethyl acetate and butyl acetate, hydrocarbon solvents such as toluene, ketone solvents such as acetone and methyl ethyl ketone, and glycol solvents such as ethylene glycol can be given as examples.

The amount of the solvent can be such as to give the flux a density and viscosity suitable for the intended use. In general, the amount of the solvent is in the range of 5–40 mass percent.

A flux according to the present invention may contain additives such as a thixotropic agent and an activator which are conventionally added to a flux.

Preferred thixotropic agents are hardened castor oil, stearamide, and the like. The amount of the thixotropic agent is preferably 0.1–10 mass percent.

An activator is added in order to improve the solderability of the flux. For example, in a rosin flux, there are cases in which an organic acid is used as an activator, but in the present invention, an organic acid is not considered as an activator. Preferred materials for use as an activator in a flux according to the present invention are hydrohalides of amines, among which polyamine hydrobromides such as triethanolamine hydrobromide and diphenylguanidine hydrobromide and the like are suitable.

By incorporating a thixotropic agent, a flux according to the present invention can be formed into a viscous liquid suitable for a flux which can be applied by printing, transfer, or the like, or for a flux for use in preparing a solder paste.

When performing soldering using a flux according to the present invention, the thermosetting resin in the flux is cured with a temperature and time profile for reflow of a eutectic solder (Sn 63%, Pb 37%), for example, and soldering of a component and securing of the component can be carried out simultaneously.

When the flux is applied by itself, the application of the flux can be carried out by screen printing, transfer, spin coating, brush application, and the like. Then, local heating for soldering can be carried out with a light beam, a soldering iron, a laser, or the like.

According to another embodiment, a flux according to the present invention and a solder alloy powder can be uniformly mixed to prepare a paste, and this can be used for soldering.

Typical examples of a solder alloy for use in a solder paste are eutectic solder (63% Sn—37% Pb, melting point 183° C.) and Sn—Ag based lead-free solder alloys [for example, 97.75% Sn—3.5% Ag—0.75% Cu (melting point 220° C.), and 96% Sn—2.5% Ag—1% Bi—0.5% Cu (melting point 220° C.)], but solder alloys other than these can also be used. A powder of the solder alloy is preferably a spherical powder obtained by the centrifugal atomizing method or the gas atomizing method. The particle size of the solder alloy is normally in the range of 200–400 mesh, but a finer powder can also be used.

Preferably the solder paste contains 50–95 mass percent and more preferably 70–90 mass percent of the solder alloy powder and 5–50 mass percent and more preferably 10–30 mass percent of flux.

Soldering with the solder paste is carried out by applying a prescribed amount in a location to be soldered by a means such as screen printing, and then heating to a reflow temperature of at least 150° C., such as to approximately 220° C. in the case of the above-described eutectic solder and to at least 240° C. in the case of the above-described Sn-Ag based lead-free solder.

When soldering an electronic component, the melting temperature of the solder alloy is at least 150° C., preferably greater than 150° C., and more preferably at least 180° C., and the reflow temperature is at least 200° C., usually in the range of 200–270° C., and preferably 230–270° C.

According to the present invention, as illustrated by the below-described examples, even in the case of a small electronic component in the form of a 0603 (0.6 mm long×0.3 mm wide) or a 1005 (1.0 mm long×0.5 mm wide), soldering can be performed with certainty, and at the same time, it can be secured to a substrate by a flux comprising a thermosetting resin, and additional securing steps such as underfilling or cleaning steps for removing flux residue after soldering become unnecessary, so the economic merits of a soldering method according to the present invention are significant.

Next, the effects of the present invention will be explained more concretely by means of examples. The examples are merely illustrative and do not limit the present invention.

EXAMPLES

Example 1

The securing strength with respect to small electronic components using each of the fluxes having the compositions shown in Table 1 was investigated.

The securing strength of each flux after carrying out heating in the same manner as during soldering of a 1005 (1.0 mm long×0.5 mm wide) LGA terminal-type chip was as shown in Table 1. The securing strength is the strength at which an electronic component secured to a printed substrate peels off under the application of a lateral force.

TABLE 1

| | Run No. | 1 | 2 | 3 | 4 | 5 |
|---|---|---|---|---|---|---|
| Flux Composition (%) | Polymerized rosin (organic acid) | 8 | 5 | — | 40 | 60 |
| | Adipic acid (organic acid) | 2 | — | 10 | — | — |
| | Hardened castor Oil (thixotropic agent) | 2 | 5 | 2 | 5 | 5 |
| | Triethanolamine HBr (activator) | 1 | 1 | 1 | 1 | 1 |
| | Epoxy resin (thermosetting) | 40 | 35 | 35 | — | — |
| | Phthalic anhydride (curing agent) | 30 | 35 | 35 | — | — |
| | Phenylglycol (solvent) | 17 | 19 | 17 | 34 | 34 |
| | Vinyl acetate resin (thermoplastic) | — | — | — | 20 | — |
| | Securing strength (g) | 1000 | 1200 | 1100 | 500 | 350 |

As shown in Table 1, the fluxes of Run Nos. 1–3 according to the present invention had a high securing strength of at least 1000 g. However, for a flux like Run No. 5, which contains a polymerized rosin but does not contain an epoxy resin, which is a thermosetting resin, the bonding strength enormously decreased. Furthermore, even with the flux of Run No. 4, which used a vinyl acetate resin, which is a thermoplastic resin, in place of a thermosetting epoxy resin, the bonding strength was low.

Example 2

The fluxes having the compositions shown in Table 2 were prepared, and 15 mass percent of each flux and 85 mass percent of a spherical powder (average particle diameter 30 micrometers) of an Sn63—Pb37 eutectic solder alloy were uniformly mixed to prepare a solder paste.

The solder paste was applied by screen printing to electrode regions provided in prescribed locations on a flat plate, chip components corresponding to small electronic components having outer dimensions of 1.0×0.5×0.3 mm were mounted on these electrode regions, and then in a reflow oven, after preheating at 150° C. for one minute, reflow was carried out by heating for 40 seconds at 200° C. or higher with a maximum heating temperature of 235° C. to complete soldering.

At this time, the solder spreading factor and the securing strength were investigated.

The solder spreading factor was determined in accordance with JIS 3197, and the securing strength was indicated by the force at the time of peeling off when a lateral force was applied to the above-described components.

The results are also shown in Table 2. In each case, the chlorine content of the solder residue was essentially zero, so it was not necessary to perform cleaning after soldering.

TABLE 2

| | Run No. | 6 | 7 | 8 | 9 | 10 | 11 | 12 |
|---|---|---|---|---|---|---|---|---|
| Flux | Polymerized rosin (organic acid) | 30 | 10 | 5 | — | 5 | — | 8 |
| Composition | Adipic acid (organic acid) | — | — | — | — | — | 10 | — |
| (%) | Hardened castor oil (thixotropic agent) | 2 | 2 | 2 | 2 | 5 | 2 | 2 |
| | Triethanolamine HBr[1] | 1 | 1 | 1 | — | — | — | 1 |
| | Epoxy resin A[2] | 30 | 40 | 40 | 40 | 35 | 35 | — |
| | Epoxy resin B[3] | — | — | — | — | — | — | 35 |
| | Phthalic anhydride (curing agent) | 20 | 30 | 40 | 40 | 35 | 35 | 35 |
| | Phenylglycol (solvent) | 17 | 17 | 12 | 18 | 20 | 18 | 19 |
| Properties | Solder spreading factor (%) | 90 | 90 | 91 | 80 | 90 | 90 | 90 |
| | Securing strength (g) | 800 | 900 | 1300 | 1800 | 1200 | 1100 | 1000 |

Notes:
[1]Activator
[2]bisphenol A epoxy resin
[3]cresol novolac epoxy resin

Embodiments of the present invention have been described above, but it should be understood that many variations are possible without departing from the technical concept thereof.

What is claimed is:

1. A soldering flux comprising 0.1–70 mass percent of an organic acid selected from rosins and carboxylic acid anhydrides, 5–40 mass percent of a solvent, and a total of 10–95 mass percent of a thermosetting resin and a curing agent, wherein during soldering of a component, the flux exhibits a function of securing the component by the thermosetting resin.

2. A soldering flux as described in claim 1 wherein the organic acid contains a carboxylic acid anhydride.

3. A soldering flux as described in claim 1 wherein the organic acid contains a rosin.

4. A soldering flux as described in claim 1 wherein the thermosetting resin is an epoxy resin.

5. A soldering flux as described in claim 4 wherein the thermosetting resin is a bisphenol A epoxy resin.

6. A soldering flux as described in claim 5 wherein the curing agent is one or more classes selected from the group consisting of carboxylic acid anhydrides and amines.

7. A soldering flux as described in claim 6 wherein the organic acid contains 0.1–50 mass percent of at least one class of organic acid other than a carboxylic acid anhydride.

8. A soldering flux as described in claim 1 further comprising 0.1–10 mass percent of a thixotropic agent.

9. A soldering paste which is a mixture of a powder of a solder alloy having a melting point of at least 150° C. and the flux described in claim 1.

10. A soldering paste as described in claim 9 wherein the total amount of the thermosetting resin and the curing agent in the flux is 50–95 mass percent.

11. A solder paste as described in claim 9 wherein the thermosetting resin in the flux is an epoxy resin.

12. A solder paste as described in claim 9 wherein the flux further contains 0.1–10 mass percent of a thixotropic agent.

13. A method for simultaneously achieving securing by solder and a resin in which a first member is soldered to a second member using the flux described in claim 1 and solder.

14. A method as described in claim 13 wherein the first member is an electronic component and the second member is a substrate having a large number of electrodes and the soldering temperature is at least 150° C.

15. A method as claimed in claim 13 wherein the first member comprises a chip component and the second member comprises a printed circuit board.

16. A method as claimed in claim 15 wherein the first member comprises a flip chip.

17. A method for simultaneously achieving securing by solder and a resin in which a first member is soldered to a second member using the solder paste described in claim 9.

18. A method as described in claim 17 wherein the first member is an electronic component and the second member is a, substrate having a large number of electrodes and the soldering temperature is at least 150° C.

19. A method as claimed in claim 17 wherein the first member comprises a chip component and the second member comprises a printed circuit board.

20. A method as claimed in claim 19 wherein the first member comprises a flip chip.

* * * * *

(12) EX PARTE REEXAMINATION CERTIFICATE (7414th)
United States Patent
Abe et al.

(10) Number: US 6,402,013 C1
(45) Certificate Issued: Mar. 23, 2010

(54) THERMOSETTING SOLDERING FLUX AND SOLDERING PROCESS

(75) Inventors: Hisayuki Abe, Ichikawa (JP); Toshihiko Taguchi, Kitakatsushika-gun (JP); Yuji Kawamata, Haga-gun (JP); Akiko Iwano, Mouka (JP)

(73) Assignees: Senju Metal Industry Co., Ltd., Adachi-Ku, Tokyo (JP); TDK Corporation, Chuo-Ku, Tokyo (JP)

Reexamination Request:
No. 90/006,724, Jul. 24, 2003

Reexamination Certificate for:
Patent No.: 6,402,013
Issued: Jun. 11, 2002
Appl. No.: 09/726,588
Filed: Dec. 1, 2000

(30) Foreign Application Priority Data

Dec. 3, 1999 (JP) .......................................... 11-344979

(51) Int. Cl.
*B23K 35/36* (2006.01)
*H05K 3/34* (2006.01)

(52) U.S. Cl. ............................ 228/223; 148/23; 148/24; 228/224; 228/248.1

(58) Field of Classification Search ........................ None
See application file for complete search history.

(56) References Cited

U.S. PATENT DOCUMENTS

| | | | | | |
|---|---|---|---|---|---|
| 2,482,923 A | * | 9/1949 | McCoy | ........................ | 148/23 |
| 2,649,362 A | * | 8/1953 | Fowler | ........................ | 51/309 |
| 3,620,374 A | * | 11/1971 | Brinkema | ................... | 210/231 |
| 3,840,287 A | * | 10/1974 | Witzke et al. | ............... | 359/274 |
| 4,216,035 A | * | 8/1980 | Bakos et al. | .................. | 148/23 |
| 4,479,983 A | * | 10/1984 | Appelt et al. | ............... | 427/493 |
| 4,789,411 A | * | 12/1988 | Eguchi et al. | ................. | 148/24 |
| 5,017,258 A | * | 5/1991 | Brown et al. | ................. | 156/294 |
| 5,128,746 A | | 7/1992 | Pennisi et al. | ................. | 357/72 |
| 5,176,759 A | * | 1/1993 | Taguchi | ........................ | 148/24 |
| 5,211,763 A | * | 5/1993 | Takemoto et al. | ............. | 148/23 |
| 5,261,593 A | * | 11/1993 | Casson et al. | .......... | 228/180.22 |
| 5,272,007 A | * | 12/1993 | Jenkinson et al. | ............ | 428/403 |
| 5,297,721 A | * | 3/1994 | Schneider et al. | ........ | 228/180.1 |
| 5,346,558 A | * | 9/1994 | Mathias | ........................ | 148/23 |
| 5,539,153 A | * | 7/1996 | Schwiebert et al. | ......... | 174/260 |
| 5,853,957 A | * | 12/1998 | Yanagawa et al. | ........... | 430/280.1 |
| 5,904,782 A | * | 5/1999 | Diep-Quang | ................. | 148/23 |
| 5,909,634 A | * | 6/1999 | Hotchkiss et al. | ........... | 438/612 |
| 6,075,080 A | * | 6/2000 | Katsuoka et al. | ............ | 524/272 |
| 6,194,788 B1 | * | 2/2001 | Gilleo et al. | ................. | 257/789 |
| 6,228,678 B1 | * | 5/2001 | Gilleo et al. | ................. | 438/108 |
| 6,265,776 B1 | * | 7/2001 | Gilleo | ........................ | 257/738 |
| 6,340,113 B1 | * | 1/2002 | Avery et al. | ............. | 228/248.5 |

FOREIGN PATENT DOCUMENTS

| | | | |
|---|---|---|---|
| JP | 59-85394 | | 5/1984 |
| JP | 1-210192 A | * | 8/1989 |
| JP | 8-90280 A | * | 4/1996 |
| JP | 10-314984 A | * | 12/1998 |

* cited by examiner

*Primary Examiner*—Alan Diamond

(57) ABSTRACT

A soldering flux suitable for soldering of small electronic components comprises 0.1–50 mass percent of an organic acid, 5–40 mass percent of a solvent, and 10–95 mass percent of a thermosetting resin (including a curing agent), which is preferably a bisphenol A epoxy resin and an acid anhydride or amine curing agent. This flux can be used to prepare a solder paste by mixing with solder powder. This soldering flux can secure an electronic component simultaneously by soldering and by the resin, simply by a soldering operation at a soldering temperature of at least 150° C., and cleaning after soldering is no longer necessary.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–20 are cancelled.

\* \* \* \* \*